US005828274A

United States Patent [19]

Jen et al.

[11] Patent Number: 5,828,274

[45] Date of Patent: Oct. 27, 1998

[54] CLAD ULTRASONIC WAVEGUIDES WITH REDUCED TRAILING ECHOES

[75] Inventors: Chen-Kuei Jen; Jean-Gabriel Legoux, both of Quebec, Canada

[73] Assignee: National Research Council of Canada, Ottawa, Canada

[21] Appl. No.: 654,973

[22] Filed: May 28, 1996

[51] Int. Cl.[6] .......... H03H 9/00

[52] U.S. Cl. .......... 333/143; 333/147; 73/644

[58] Field of Search .......... 333/141, 142, 333/143, 147; 73/617, 644

[56] References Cited

U.S. PATENT DOCUMENTS

| | | | |
|---|---|---|---|
| 2,565,725 | 8/1951 | Frederick et al. | 333/142 X |
| 3,922,622 | 11/1975 | Boyd et al. | 333/145 |
| 4,077,023 | 2/1978 | Boyd et al. | 333/147 |
| 4,742,318 | 5/1988 | Jen et al. | 333/147 X |
| 4,743,870 | 5/1988 | Jen et al. | 333/147 |
| 5,241,287 | 8/1993 | Jen | 333/143 |
| 5,286,109 | 2/1994 | Hanscombe et al. | 333/142 X |

OTHER PUBLICATIONS

C.–K. Jen et al, "Fabrication and Characterization of Continuously Cast Clad Metallic Buffer Rods", J.Acoust. Soc.Am. 91(6) 1992 pp. 3565–3570.

H. Soda et al, "Fabrication and Characterization of Aluminum Clad Al–Cu Alloy Coral Rod" Materials Science and Technology, Nov. 1995, vol. 11, pp. 1174–1179.

L.C. Lynnworth, "Ultrasonic Temperature Measurement," Measurement & Control 13(6) Dec. 1979, pp. 106–108.

C.–K. Jen et al, "Long Isotopic Buffer Rods", J. Acoust. Soc. Am. 88(1), Jul. 1990 pp. 23–25.

*Primary Examiner*—Robert Pascal
*Assistant Examiner*—Justin P. Bettendorf
*Attorney, Agent, or Firm*—Juliusz Szereszewski

[57] ABSTRACT

Ultrasonic buffer rods are useful for on-line process control of industrial material processes at elevated temperatures. In order to increase the signal-to-noise ratio in the reflected ultrasonic waves revealing the information of the condition of the materials being processed, clad ultrasonic waveguides consisting of a tapered or uniform core and a cladding are proposed. The core is made of a low ultrasonic loss material. Preferably, the cladding has a higher ultrasonic velocity than the core. The cladding may be thermally sprayed over the core. The waveguides are simple, rugged, machinable and operable at elevated temperatures.

16 Claims, 12 Drawing Sheets

CLAD ULTRASONIC WAVEGUIDES WITH REDUCED TRAILING ECHOES

FIELD OF INVENTION

This invention relates to ultrasonic devices for on-line process control of industrial material processes, and more particularly to clad solid ultrasonic waveguides, also called buffer rods, in which ultrasonic waves can propagate.

BACKGROUND OF THE INVENTION

As new materials are developed, quality control becomes increasingly complex. Ultrasonic pulse-echo techniques are often used for such purposes because they are simple, fast and economical, and have the capability to probe interior part of the materials. The techniques require transducers of large bandwidth and high efficiency. The parameters used may be ultrasonic velocity, attenuation, reflection and transmission coefficients.

However, as on-line ultrasonic monitoring measurements of industrial processes are often performed at elevated temperatures, it is not practical to contact ultrasonic transducers directly with the materials monitored thereby exposing the transducers to the adverse conditions. Instead, ultrasonic waveguides are installed between the transducers and the materials to transmit the ultrasonic waves from the transducer into the sample material and back to the transducer for the monitoring of any changes in elastic properties of the processed materials.

Due to wave diffraction effects and the finite diameter of the ultrasonic waveguide, also called buffer rod, spurious ultrasonic echoes may be present in the midst of the signals containing the desired sample information. Also termed trailing echoes, these echoes will always arrive later than the directly transmitted or reflected longitudinal echoes and often interfere with the desired signals.

Elastic waveguides known e.g. from U.S. Pat. No. 3,922,622 issued Nov. 25, 1975 to G. D. Boyd et al; U.S. Pat. No. 4,077,023 issued Feb. 28, 1978 to G. D. Boyd and R. N. Thurston; and U.S. Pat. No. 4,743,870 issued May 10, 1988 to Jen et al. for propagating ultrasonic waves consist of a solid core and an outer cladding. The first two references contain the requirement that the bulk shear wave velocity of the cladding must be higher than that of the core and the Jen et al. reference requires that the bulk longitudinal velocity of the cladding must be higher than that of the core. According to these three references, the cladding must be of a low ultrasonic loss material. The waveguides are useful to reduce spurious echoes but while they can be easily made of glasses it is difficult to cost-effectively make them with metallic core and cladding.

C. K. Jen et al. (J. Acoust. Soc. Am., 91 (6), June 1992) and H. Soda et al. (Material Science and Tech., 11, November 1995) used casting techniques to fabricate clad metallic waveguides in which the longitudinal and shear wave velocities of the core are less than those of the cladding. Ultrasonic waveguides consisting of a tin-lead core and pure tin cladding, and a aluminum-copper core and pure aluminum cladding were fabricated and tested. The test results showed that these waveguides are good for longitudinal wave propagation but not good for shear wave propagation. These two types of waveguides can be used satisfactorily at temperatures below 250° C. Above such temperature a phase change in the materials will occur and thus disturb the ultrasonic waves propagating in the waveguide.

Another way of dealing with trailing echoes is proposed in U.S. Pat. No. 5,241,287 issued Aug. 31, 1993 to C. K. Jen.

The patent describes an ultrasonic waveguide having a core with a radially graded ultrasonic velocity profile. This waveguide can be made of glasses as core materials but cannot be fabricated cost-effectively of metals.

C. K. Jen et al. (J. Acoust. Soc. Am., 88 (1), July 1990) proposed another approach for the reduction of trailing echoes, wherein the ultrasonic waveguide is of tapered shape and without a cladding. The disadvantages of such a non-clad buffer rod are that, firstly, it is difficult to hold the buffer rod in a practical way. Any disturbance in the periphery of the taper shape, for example a thread for fastening the rod to a material processing machine, will significantly deteriorate the signal. Secondly, while a non-clad tapered rod is effective to reduce trailing echoes, its signal strength hence total signal to noise ratio is not high.

For achieving quasi-distributed temperature sensing, L. C. Lynnworth (Measurements and Control, 13(6), pp. 106–108, 1979) reported an ultrasonic method using a non-clad ribbon waveguide with notches along the guide. The drawback of this waveguide is that it can only be used when the waveguide does not contact another object. For instance, it can not be mounted on industrial machines because the signals will be significantly disturbed due to a change in the boundary conditions.

Glass waveguides, even clad ones, are usually brittle, and there is a need for rugged high-performance ultrasonic waveguides made e.g. of metals and in which spurious trailing echoes are low and the signal strength is high. There is also a need for a clad waveguide which can be used for quasi-distributed temperature sensing and can be mounted into manufacturing devices.

SUMMARY OF THE INVENTION

According to one embodiment of the invention, there is provided a solid elongated ultrasonic waveguide for transmitting ultrasonic waves generated e.g. by a transducer into an object and reflected from the object. The waveguide is composed of a core with a tapered shape and a cladding. The tapered core means that the diameter of the core varies lengthwise and no section of the core has a uniform diameter. The core and the cladding are preferably, but no necessarily, made of materials having low ultrasonic loss, such as metals, ceramics and glasses with fine grains. The core-cladding interface should preferably have a good mechanical bond and provide a good ultrasonic coupling between the core and the cladding.

According to another embodiment of the invention, there is provided a solid elongated ultrasonic waveguide for transmitting ultrasonic waves which are generated e.g. by a transducer into an object and reflected from the object. The waveguide comprises a core with a uniform diameter and a cladding. The materials of the core and the cladding are selected such that the ultrasonic velocity, both longitudinal and shear, of the core is higher than that of the cladding. The core is made of a material having low ultrasonic loss, such as metals, ceramics and glasses with fine grains. The cladding can be made of high ultrasonic loss or low-loss materials. The core-cladding interface should preferably have a good mechanical bond and provide a good ultrasonic coupling between the core and the cladding.

For the purposes of this specification, low ultrasonic loss is defined as less than 0.5 dB/cm at 5 MHz, and the loss higher than about 2 dB/cm at the same frequency is considered high. The range therebetween is considered medium loss. A list of materials suitable for the purpose of the instant invention, indicative of the respective ultrasonic losses, is given hereinbelow.

Tests have been conducted to validate the invention in the frequency range between 1 and 12 MHz that is normally suitable for on-line ultrasonic monitoring of industrial materials processes. For the tapered waveguides of the invention, the results indicate that for a good reduction of the spurious echoes, a 1.5 degree tapering angle is acceptable. The small end of the tapered core should be more than three ultrasonic wavelengths in diameter. A larger tapering angle leads to a better signal to noise ratio but also to a larger size of the buffer rod.

The minimum thickness of the cladding, for either tapered or uniform rods, is about 3 mm for low-loss cladding material and 1 mm for high-loss cladding material.

Preferably, to ensure good ultrasonic guidance, the product of the longitudinal velocity and the density of the core of the waveguides of the invention should be within one order of magnitude of the respective product for the cladding.

Metallic cladding can be applied on the waveguides of the invention by known thermal spray techniques.

Accordingly, the waveguides of the invention may be made of materials having a melting point above about 500° C.

For clad tapered buffer rods the longitudinal and shear wave velocities of the core should preferably—but not necessarily—be lower than those of the cladding.

For clad uniform buffer rods the longitudinal and shear wave velocities of the core are higher than those of the cladding.

For both tapered and uniform waveguides of the invention, the core and the cladding are preferably made of low ultrasonic loss materials. The cladding may optionally be of high loss material.

The thermal expansion coefficient of the core material should preferably be higher than that of the cladding.

The cladding may consist of two or more dissimilar layers. One or more additional cladding layers may be deposited over the first layer e.g. for machining purposes.

The core may be round in cross section but may also be of rectangular, square or other non-circular shapes.

BRIEF DESCRIPTION OF THE DRAWINGS

For a more complete understanding of the present invention and for further objects and advantages thereof, reference may be made to the following description taken in conjunction with the accompanying drawing in which.

DETAILED DESCRIPTION OF THE PREFERRED EMBODIMENTS OF THE INVENTION

Figure 1:
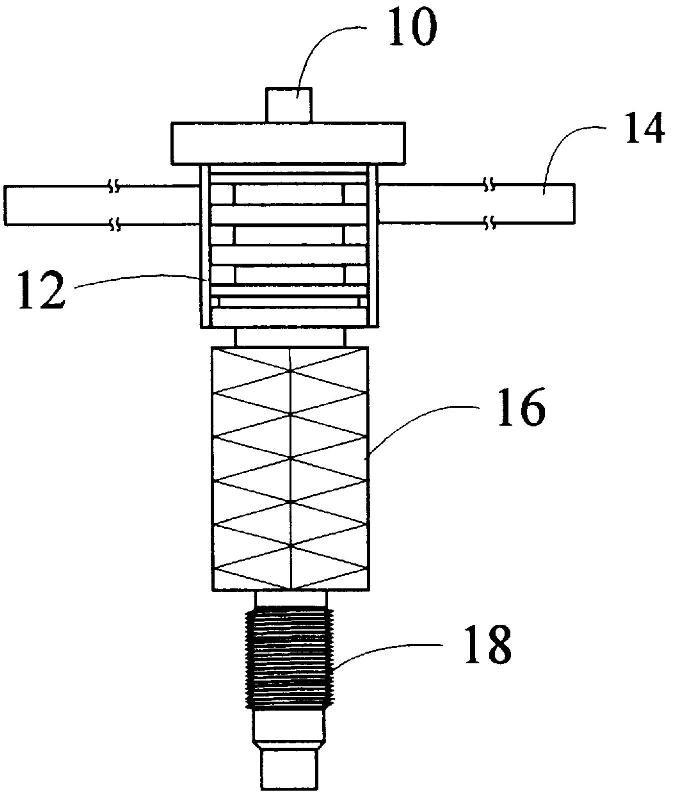
Fig. 1 (Prior Art)
FIG. 1 is a schematic view of a prior art non-clad buffer rod with a water cooling system and grooves to reduce trailing echoes.

FIG. 1 shows a conventional non-clad metallic buffer rod used e.g. for the ultrasonic monitoring of polymer extrusion at elevated temperatures. The rod has a transducer 10, a water cooling system 12 with a water supply conduit 14, a grooved section 16 and a thread 18. In order not to disturb the extrusion machine, the head of the buffer rod is machined to the exact shape of the head of a normal pressure probe used for the same machine, so that one can unscrew the pressure probe and install the buffer rod at the same place and perform the ultrasonic monitoring. Unfortunately, the thread of the head significantly deteriorates the signal-to-noise ratio (SNR) of the ultrasonic signals propagating in the buffer rod.

Figure 2A:
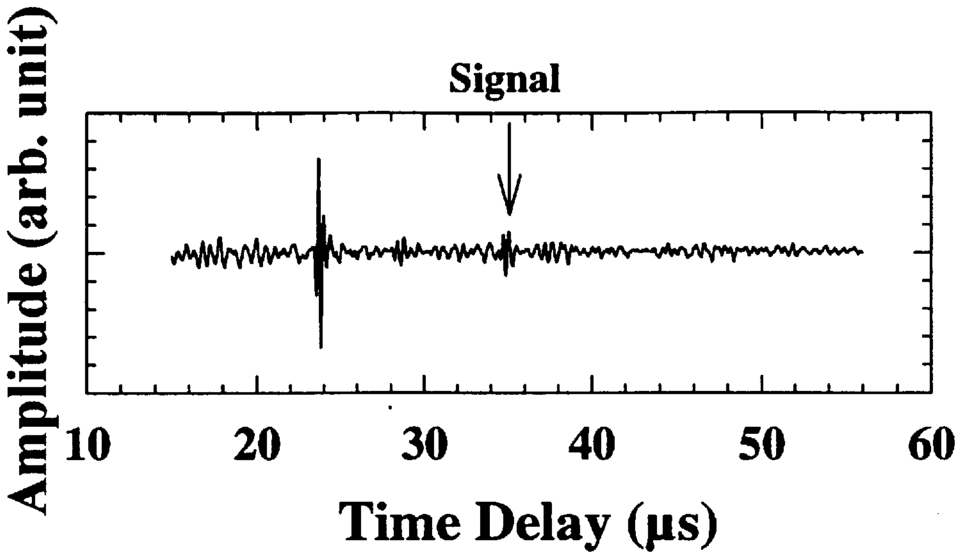
FIG. 2*a* is a graph of reflected 5 MHz longitudinal wave signals from the buffer rod of FIG. 1.
Figure 2B:
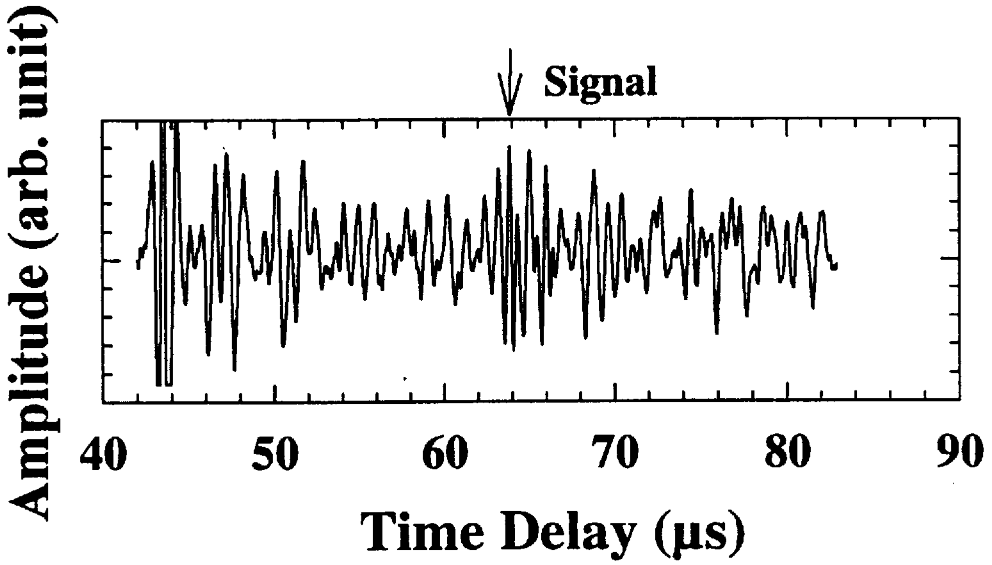
FIG. 2*b* is a graph of reflected 5 MHz shear wave signals from the buffer rod of FIG. 1.

FIGS. 2*a* and 2*b* show the reflected 5 MHz longitudinal and shear wave signals respectively of the buffer rod of FIG. 1. The SNR is less than 6 dB which is not enough for the ultrasonic monitoring, and therefore this buffer rod must be used in the transmission mode in which two identical buffer rods must be used. The transmission mode requires access on two sides of the process, and also requires the machining of another access hole in the production equipment, thus it is undesirable and less practical.

Figure 3A:
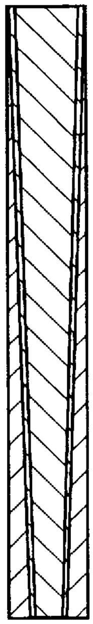
FIG. 3*a* is a cross-sectional view of a double-clad tapered buffer rod of the invention.
Figure 3B:
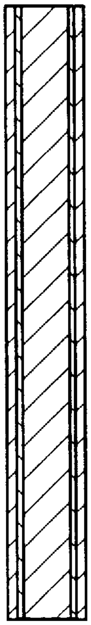
FIG. 3*b* is a cross-sectional view of a double-clad uniform buffer rod.
Figure 4A:
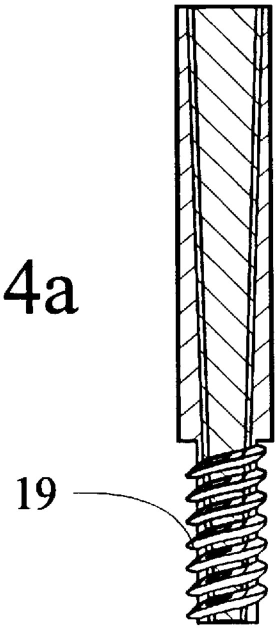
FIG. 4*a* is a view of a clad tapered buffer rod with a machined thread.
Figure 4B:
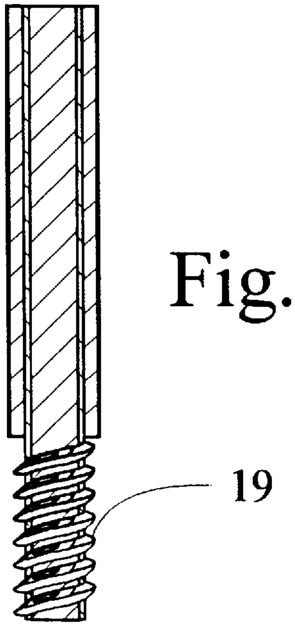
FIG. 4*b* is a view of a clad uniform buffer rod with a machined thread.

The clad buffer rods of the invention have a core and a cladding. The core can be of a tapered or a uniform shape as shown in FIGS. 3*a* and 3*b* respectively. It can be seen that the cladding may consist of two (or more) layers, for instance one layer of stainless steel and one layer of brass. The first layer is for the enhancement of ultrasonic guidance and the second layer is to facilitate the machining purposes such as the fabrication of thread 19 shown in FIGS. 4*a* and 4*b*. It can be seen that the second cladding does not have to have longitudinally uniform thickness. The core is made of a material with low ultrasonic loss.

Figure 5:
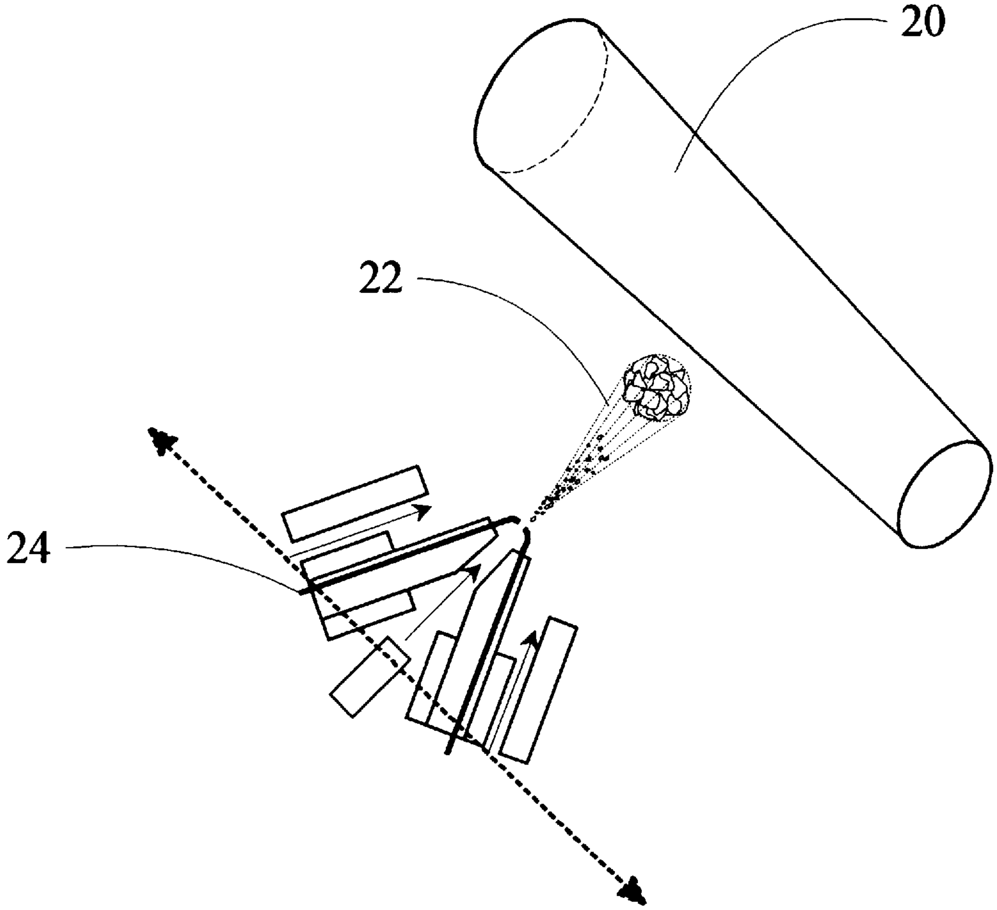
FIG. 5 is a schematic illustration of a thermal arc spray technique for the fabrication of the cladding.

Both layers of cladding can be applied by a known thermal spray technique such as thermal arc spraying, plasma spraying, flame spraying etc. A schematic of a thermal arc spray system is shown in FIG. 5. A rotating core 20 is sprayed with a stream of molten particles 22 generated from two wire electrodes 24 and carried by atomizing gas. The spraying assembly is translated parallel to the longitudinal axis of the core 20 as shown by the arrows.

Thermal spraying is a process which combines thermal energy for heating and melting with kinetic energy for propelling a dispersion of droplets to a surface where the droplets impinge, spread, solidify and incrementally form a surface layer. Thermal spray is a “line-of-sight” process where the arriving droplets, from which the coating is formed, are deposited only onto surfaces that are directly in line with the droplets’ direction. Thermal spray processes permit relatively high coating rates and wide compositional ranges. The resultant new surface materials are considered overlay coatings which can be defined as a new surface material added to the original surface. Also, because there is no mixing or dilution between the coating and the substrate, the thermal spray process preserves the base material’s composition. Not only can the thermal spray technique be used to fabricate thick cladding but it can also be used to spray onto cores having different cross-sectional shapes such as rectangular, square, triangular or other shapes. The waveguides of the present invention can comprise cores having such varied cross-sectional shapes.

While the embodiments illustrated and described herein represent straight rods, it is conceivable to realize the advantages of the invention using rods of a non-straight linear shape, e.g. having a bend. It is reasonable to assume that a signal loss would occur and the SNR would be somewhat reduced.

Figure 6A:
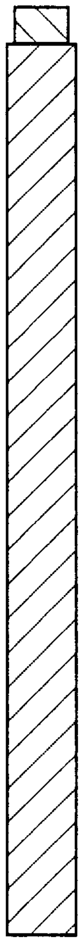
Fig. 6a (Prior Art)
FIG. 6*a* is a schematic view of a conventional non-clad uniform aluminum buffer rod of 6.35 mm diameter and 136.5 mm length.
Figure 6B:
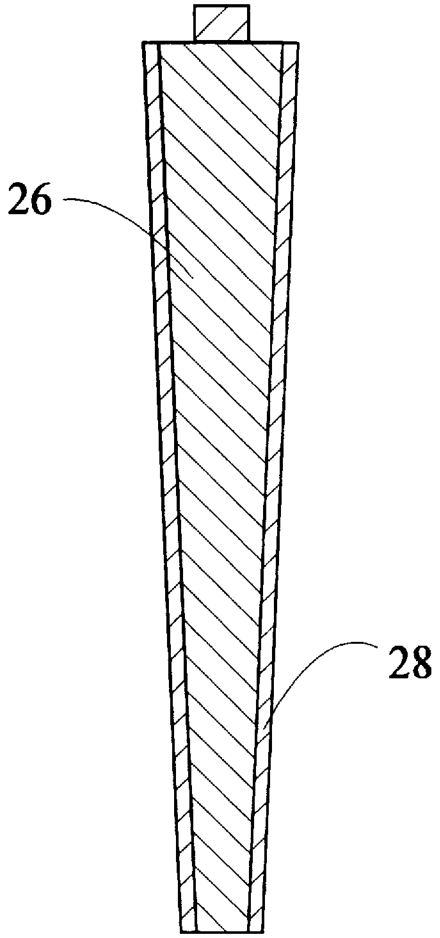
FIG. 6*b* is a schematic view of a clad tapered buffer rod of 136.5 mm length having a tapered aluminum core with a small end of 4.8 mm diameter, a large end of 12.7 mm diameter and a 2.0 mm thick stainless steel cladding.

FIG. 6*a* shows a conventional non-clad uniform aluminum buffer rod of 6.35 mm diameter used for a comparison with a clad tapered buffer rod consisting of a frustoconical aluminum core 26 having a small end of 4.8 mm diameter and a large end of 12.7 mm diameter, and a 2.0 mm thick stainless steel cladding 28 (FIG. 6*b*). The length of both rods was 136.5 mm. As can be calculated, the resulting taper angle $\alpha$ was about 1.6°. The measurement results of reflected 5 MHz longitudinal and shear wave signals from the end of the buffer rods shown in FIGS. 6*a* and 6*b* are given in FIGS. 7*a* and 7*b* respectively. The upper and lower curves are for the non-clad and clad tapered rod respectively. It can be seen that the clad tapered case significantly improves the SNR of the longitudinal waves and the trailing echoes are completely eliminated.

Figure 7A:
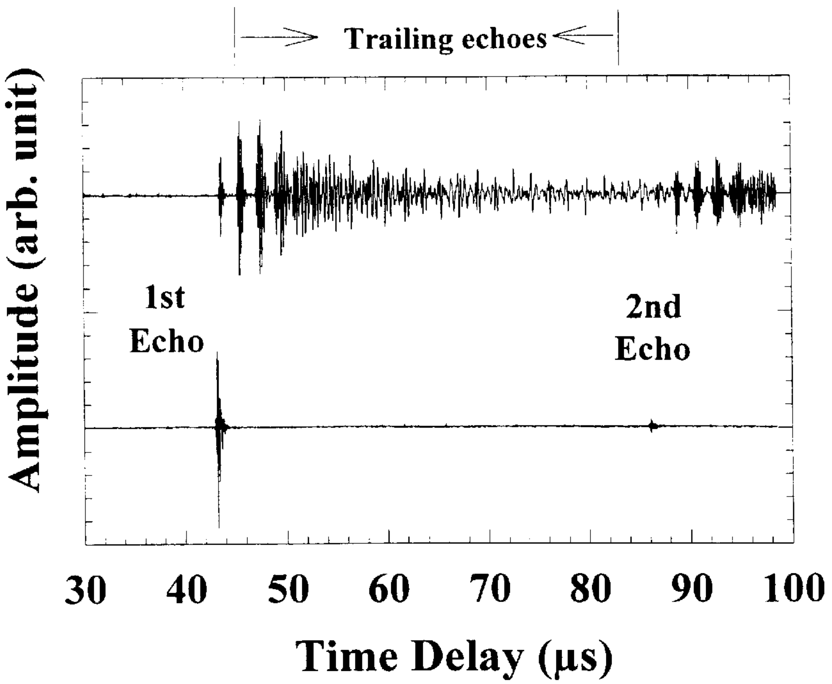
FIG. 7*a* illustrates reflected 5 MHz longitudinal wave signals from the buffer rods shown in FIG. 6*a* (upper curve) and FIG. 6*b* (lower curve)
Figure 7B:
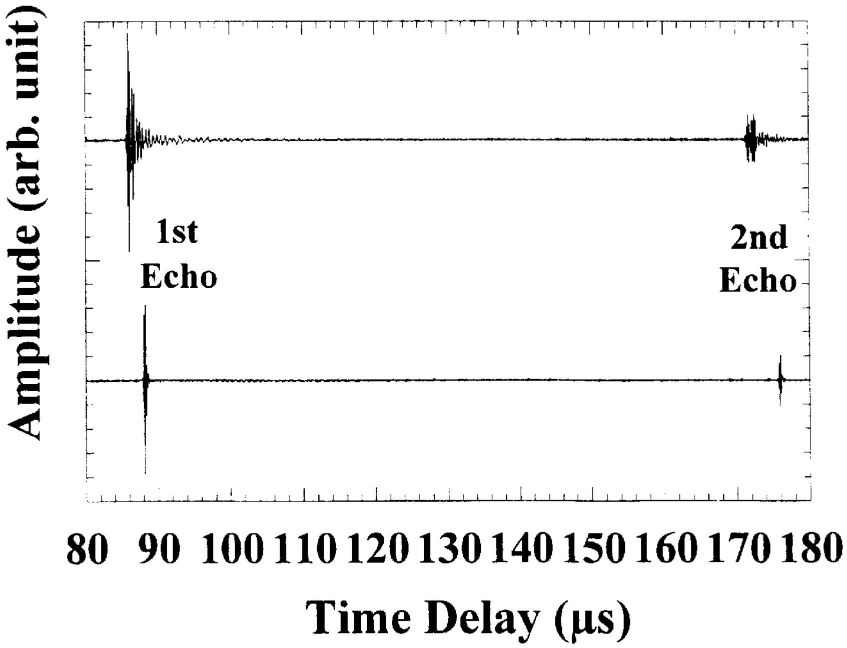
FIG. 7*b* illustrates reflected 5 MHz shear wave signals from the buffer rods shown in FIG. 6*a* (upper curve) and 6*b* (lower curve)

FIG. 7*a* also demonstrates that for rods of the same length, the time delay of the first longitudinal echo for the clad buffer rod is shorter than for the non-clad rod, but in the shear wave case the reverse is true as shown in FIG. 7*b*. FIGS. 7*a* and 7*b* indicate that the cladding does affect both the longitudinal and shear ultrasonic wave guidance in the tapered core. In this case, the ultrasonic wavelength at 5 MHz is about 1.2 mm and the cladding is 2 mm thick.

Figure 8A:
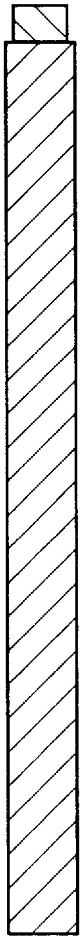
Fig. 8a (Prior Art)
FIG. 8*a* shows a prior art non-clad uniform aluminum buffer rod of 6.35 mm diameter and 169.5 mm in length.
Figure 8B:
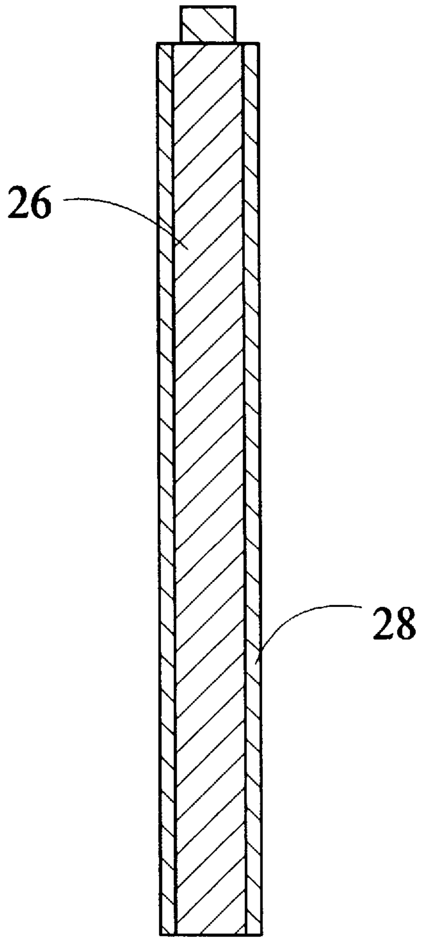
FIG. 8*b* shows a clad uniform buffer rod 169.5 mm in length having a uniform 6.35 mm diameter aluminum core and a 2.5 mm thick stainless steel cladding.

FIG. 8*a* shows a prior art non-clad cylindrical aluminum buffer rod of 6.35 mm diameter and 169.5 mm length, and FIG. 8*b* shows a clad cylindrical buffer rod of the same length, consisting of a uniform 6.35 mm diameter aluminum core with a 2.5 mm thick stainless steel cladding. The measurement results of reflected 5 MHz longitudinal and shear wave signals from the end of the buffer rods shown in FIGS. 8*a* and 8*b* are given in FIGS. 9*a* and 9*b* respectively. The upper and lower curves are for the non-clad and clad uniform cases, respectively. One can see that the cladding significantly improves the SNR of the longitudinal waves and the trailing echoes are completely eliminated. In this case the longitudinal velocity of the aluminum core is 6200 m/s which is larger than 5800 m/s, the longitudinal velocity of the porous stainless steel cladding. This is also the case for shear waves. The thermally sprayed claddings have high porosity giving rise to high ultrasonic losses. It will be appreciated that this feature distinguishes the invention from the clad waveguides of the abovementioned prior art (U.S. Pat. Nos. 4,922,622, 4,077,023 and 4,743,870) according to which the bulk longitudinal and shear wave velocities of the cladding must be larger than those of the core and the cladding must be made of low ultrasonic loss material. The advantage of such cladding material as thermally sprayed stainless steel (a high ultrasonic loss material) is that the thickness of the cladding can be very small. For instance, in the embodiments illustrated in FIGS. 6*b* and 8*b*, cladding thickness of only 1.67 wavelength is enough to maintain the ultrasonic guidance in the core. This means that the portion of the cladding having thickness greater than 1.67 wavelength can be used for purposes of machining such as thread shown in FIGS. 4*a* and 4*b*.

Figure 9A:
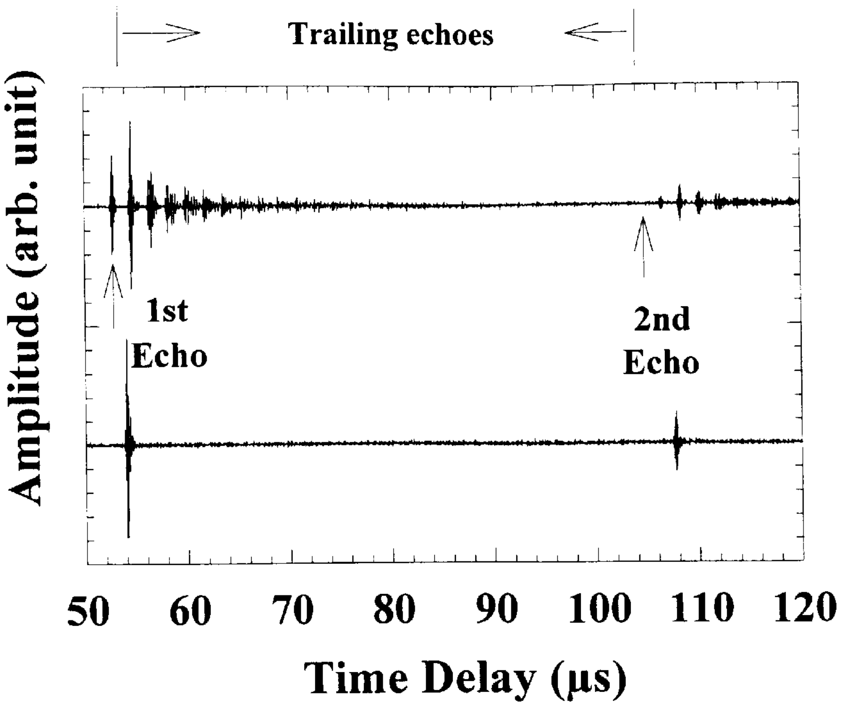
FIG. 9*a* illustrates reflected 5 MHz longitudinal wave signals from the buffer rods shown in FIG. 8*a* (upper curve) and FIG. 8*b* (lower curve)
Figure 9B:
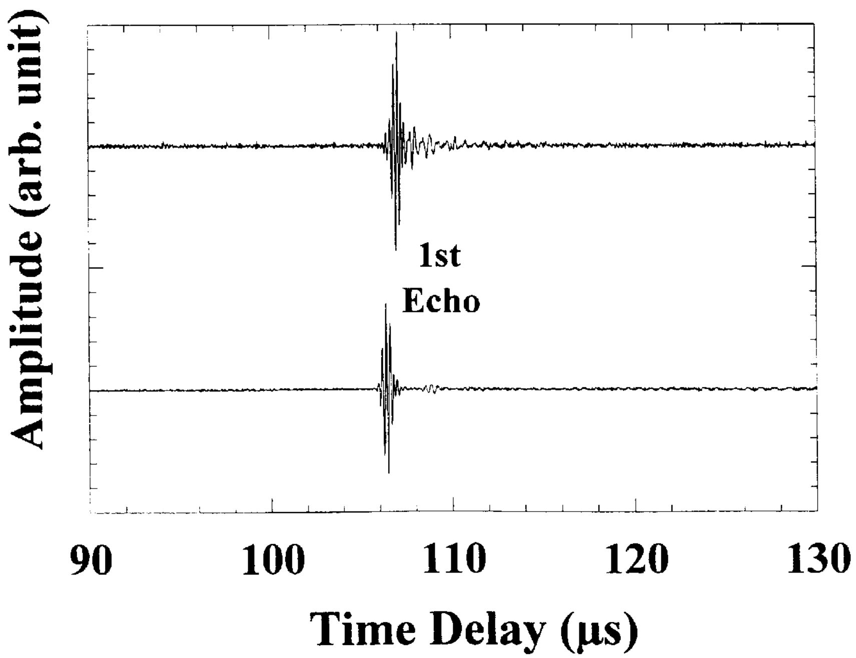
FIG. 9*b* illustrates reflected 5 MHz shear wave signals from the buffer rods shown in FIG. 8*a* (upper curve) and FIG. 8*b* (lower curve)

In FIG. 9*a* one can also see that for the same rod length, the time delay of the first longitudinal echo for the clad buffer rod is larger than for the non-clad case but in the shear wave case as shown in FIG. 9*b* the reverse is true. This phenomenon is a reverse of those in FIGS. 7*a* and 7*b* for the clad tapered buffer rod. It is therefore logical to conclude that the guidance principles for longitudinal and shear waves in the clad tapered buffer rods are different from those in the clad uniform buffer rods. It also means that the cladding of such clad uniform (in cross-section) buffer rods affects the ultrasonic wave guidance in the core. Again, in this case—FIGS. 9*a* and 9*b*—the ultrasonic wavelength at 5 MHz is about 1.2 mm and the cladding is 2 mm thick. Because the cladding is made of a high ultrasonic loss material, cladding with a thickness of slightly more than 1.67 ultrasonic wavelength is satisfactory. Such relatively thin cladding means that the buffer rod can be relatively thin and light weight. FIGS. 9*a* and 9*b* also indicate that the ratio of the amplitude of the second echo to the amplitude of the first echo is higher for the clad uniform buffer rod than the non-clad buffer rod. This finding proves further the proper guiding of ultrasonic waves in the core of the clad uniform buffer rods of the invention.

Figure 10:
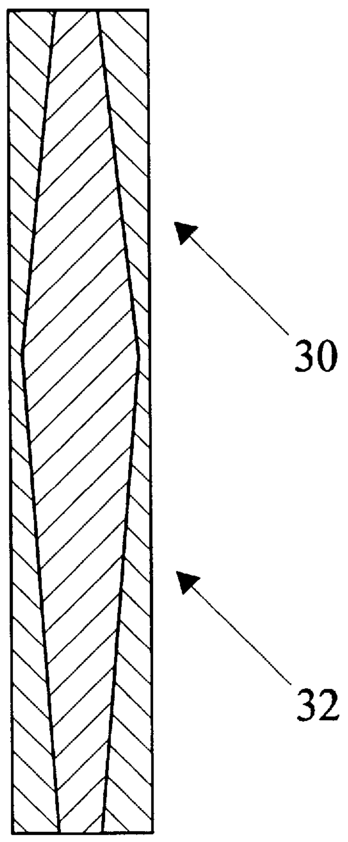
FIG. 10 shows a clad buffer rod having two tapered portions.

One difference between the clad tapered and clad uniform buffer rods resides in that the clad tapered buffer rods are less sensitive to the ultrasonic loss of the material of the cladding and the core-cladding interface condition than the clad uniform buffer rods. In principle, the larger the tapered angle, the less sensitivity to the cladding quality and the core-cladding interface condition. However, with a greater taper angle, the buffer rod may become too bulky for practical use. To reduce such concern, FIG. 10 shows another embodiment of our invention in which the core of a clad tapered buffer rod has two interconnected tapered portions 30,32. The invention encompasses clad tapered buffer rods having several such tapered core regions alternating between convergence and divergence respectively.

Using thermal spraying, claddings can be produced on core materials having rectangular, square, triangular or other cross-sectional shapes. A theoretical analysis indicates that such waveguides which are also within the scope of the present invention, are virtually free of undesired trailing echoes.

Figure 11A:
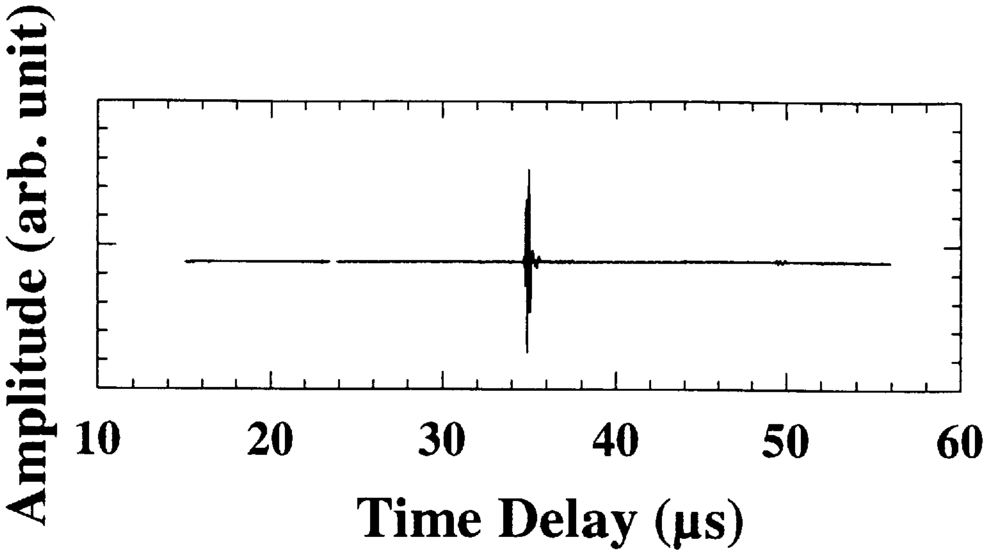
FIG. 11*a* illustrates reflected 5 MHz longitudinal wave signals from a clad tapered buffer rod consisting of a tapered steel core and a stainless steel cladding and having a similar length and external machined shape as the buffer rod of FIG. 1.
Figure 11B:
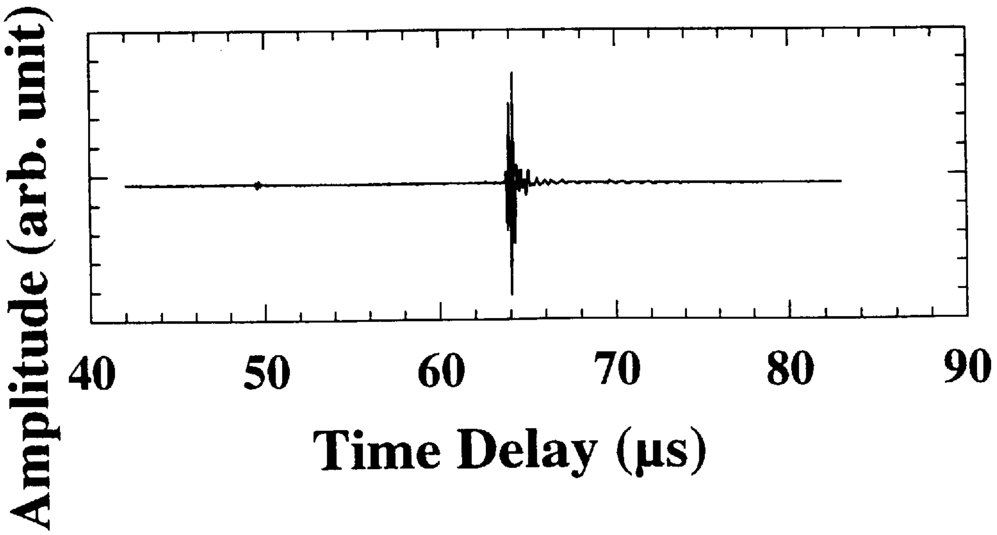
FIG. 11*b* illustrates reflected 5 MHz shear wave signals from the same buffer rod as in FIG. 11*a;*

In order to compare the performance (FIGS. 2*a* and 2*b*) of a conventional buffer rod (FIG. 1), with the performance of a buffer rod of the invention, a clad tapered buffer rod was prepared having exactly the same length, a tapered core and a similarly externally machined shape as the one shown in FIG. 1. The external shape of this clad tapered buffer rod was made first cylindrical like the one shown in FIG. 10. To that effect, a thick cladding was deposited at the small end and a thin cladding was made at the large end. The cladding was then machined to a similar shape as that illustrated in FIG. 1. The machined portions (grooves) were not deep enough to reach the core. The tapered core was made of steel and the cladding was made of stainless steel. FIGS. 11*a* and 11*b* show the reflected longitudinal and shear wave echoes respectively measured at 5 MHz. It can be seen that an improvement of SNR of more than 45 dB was achieved.

In another embodiment of the invention, clad tapered and uniform buffer rods were also made using zirconium as the core material and stainless steel and brass as the (first and second) layers of the cladding. The performance of these rods was also excellent which means that the SNR of the reflected echo from a 15 cm long clad buffer rod was more than 45 dB.

Because of the availability of thermal spray techniques, the melting temperatures of the core and cladding materials can be higher than 1000° C., and the resulting buffer rods of the invention can work properly at elevated temperatures.

Advantageously, materials of the core and cladding of the buffer rods of the instant inventions are selected to have melting temperature above 500° C.

The following table illustrates elastic properties and melting temperatures of certain metals suitable for the purpose of the present invention.

Elastic Properties and Melting Temperatures of Certain Metals

| Metals | M.T. (°C.) | ρ (kg/m$^3$) | $V_L$ (m/s) | $V_S$ (m/s) | $\rho V_L$ (×10$^7$) |
|---|---|---|---|---|---|
| Aluminum | 660 | 2698 | 6374 | 3111 | 1.72 |
| Chromium | 1875 | 7194 | 6608 | 4005 | 4.75 |
| Copper | 1083 | 8933 | 4759 | 2325 | 4.25 |
| Gold | 1063 | 19281 | 3240 | 1200 | 6.24 |
| Iron | 1536 | 7690 | 5957 | 3224 | 4.58 |
| Molybdenum | 2610 | 10222 | 6475 | 3505 | 6.62 |
| Nickel | 1453 | 8907 | 5814 | 3078 | 5.18 |
| Platinum | 1769 | 21450 | 3260 | 1730 | 6.99 |
| Silver | 961 | 10500 | 3704 | 1698 | 3.89 |
| Stainless Steel | 1536 | 7800 | 5980 | 3297 | 4.66 |
| Titanium | 1668 | 4508 | 6130 | 3182 | 2.76 |
| Tungsten | 3387 | 19254 | 5221 | 2887 | 10.19 |
| Vanadium | 1900 | 6090 | 6023 | 2774 | 3.67 |
| Zirconium | 1852 | 6507 | 4650 | 2250 | 3.02 |

In the above table, $V_L$ denotes longitudinal velocity and $V_S$ denotes shear velocity.

Figure 12A:
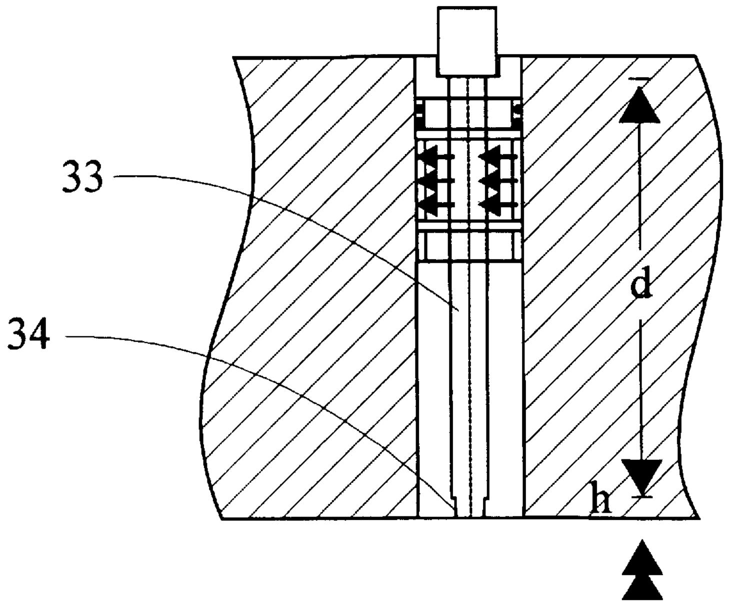
FIG. 12*a* illustrates a clad uniform buffer rod of the invention with a step in the core, for temperature sensing.
Figure 12B:
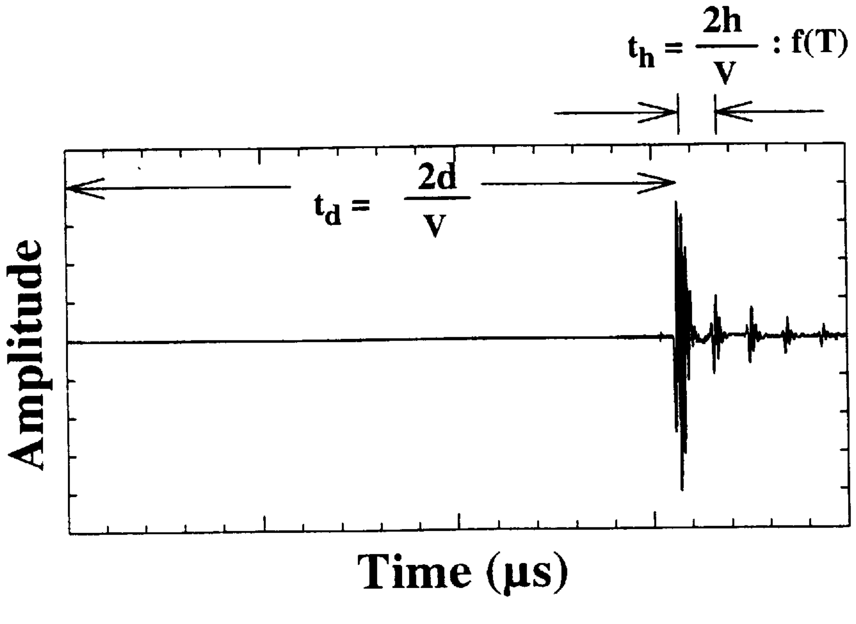
FIG. 12*b* illustrates the received ultrasonic signals from the buffer rod of FIG. 12*a;*

It has also been found that clad waveguides are effective for quasi-distributed temperature sensing. As illustrated in FIG. 12*a,* the core 33 made of steel (low-loss) has a step (discontinuity) 34, created at its end and a cladding made of stainless steel. The resulting ultrasonic signals are illustrated in FIG. 12*b.*

Let the length of this step be h=1 mm with a buffer rod made of steel in which the velocity is v=6000 m/s. The round trip travelling time of the ultrasonic signal within this 1 mm portion is $t_h$=h/v=0.33 μs. If one uses a signal at 20 MHz and assumes five cycles of the pulse duration (i.e. broadband) then the total duration of the pulse is 0.25 μs which is less than 0.33 μs. It means that the ultrasonic echoes which traverse back and forth within this 1 mm section will not overlap, thus a time delay or velocity measurement resolution is expected to be around 1 m/s. The velocity variation rate of steel vs. temperature is about 1 m/s per °C., therefore the temperature measurement precision of ±1° C. may be achieved. Similar steps (disturbances) created in the core of a clad tapered buffer rod would provide the same temperature sensing function.

Figure 13A:
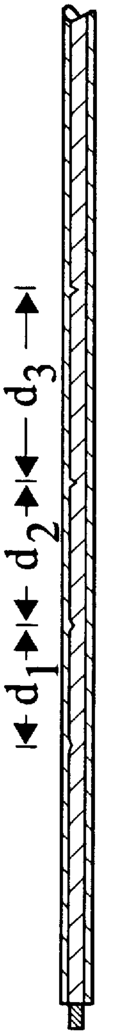
FIG. 13*a* illustrates a clad uniform buffer rod with multiple notches along the core to achieve quasi-distributed temperature sensing.
Figure 13B:
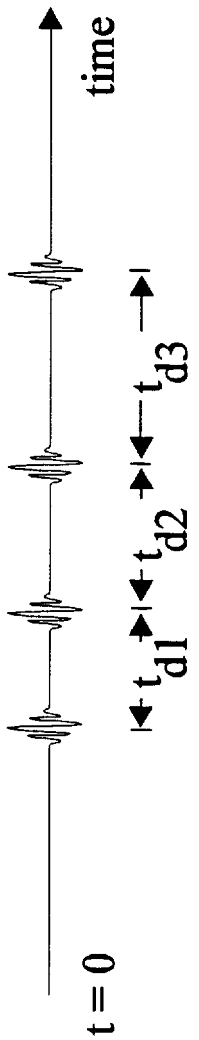
FIG. 13*b* illustrates the ultrasonic signals received from the rod of FIG. 13*a*.

Furthermore, one can achieve quasi-distributed temperature sensing by creating multiple discontinuities such as notches 36 in the core along clad tapered buffer rods or clad uniform buffer rods as shown in FIG. 13*a*. FIG. 13*b* shows the received ultrasonic signals. The variation of the time delay such as $t_{d1}$, $t_{d2}$ and $t_{d3}$ between the two adjacent echoes induced by the corresponding notches can be used to evaluate respectively the average temperature changes in the waveguide section $d_1$, $d_2$ and $d_3$ between these two adjacent notches.

Some of the advantages of the invention are as follows: high signal to spurious ultrasonic noise ratio due to the elimination or significant reduction of the trailing echoes; high signal strength due to proper wave guidance; suitability for reflection and transmission measurement geometries; suitability for both longitudinal and shear waves; low loss; machinability; elimination of crosstalk among buffer rods due to the energy concentration in the core; adaptability for exploitation at high temperatures.

We claim:

1. An ultrasonic waveguide comprising:

a solid core in which acoustic waves can propagate, said entire core having a longitudinally tapered shape of continuously changing diameter, the tapered shape effective to reduce the occurrence of trailing echoes in said acoustic waves, and a solid cladding adhering contiguously to said core except end surfaces thereof such as too provide ultrasonic coupling between said core and said cladding, wherein the core and the cladding have each a specific density and longitudinal acoustic velocity and are selected such that the product of the longitudinal velocity and the density of the core is within one order of magnitude of the product of the longitudinal velocity and the density of said cladding.

2. The waveguide of claim 1 wherein said core has a plurality of tapered portions.

3. The waveguide of claim 1 wherein said core is tapered at an angle of at least 1.5°.

4. The waveguide of claim 1 wherein said core has at least one shape disturbance at a predetermined location, the disturbance being effective to enable temperature sensing.

5. The waveguide of claim 1 wherein said solid cladding comprises at least two dissimilar cladding layers.

6. The waveguide of claim 1 wherein said core is of a material having low ultrasonic loss.

7. The waveguide of claim 1 wherein both said core and said cladding is of a metal having a melting point above 500° C.

8. The waveguide of claim 1 wherein said core and said cladding are respectively of a material such that the longitudinal and shear wave velocities of the core are lower than the respective velocities of the cladding.

9. The waveguide of claim 1 wherein said core has a non-circular cross-section.

10. An ultrasonic waveguide useful as a buffer rod comprising a solid core in which ultrasonic weaves can propagate, said core having longitudinally uniform cross-sectional size, and a solid cladding adhering contiguously to said core except end surfaces thereof such as to provide ultrasonic coupling between said core and said cladding, wherein said core and said cladding is respectively of a material selected such that the ultrasonic velocity of said core is higher than the respective velocity of said cladding, the product of the longitudinal velocity and the density of the core being within one order of magnitude of the product of the longitudinal velocity and the density of said cladding, and said material of said core has an ultrasonic loss of less than 0.5 dB/cm at 5 MHz.

11. The waveguide of claim 10 wherein said core has at least one shape disturbance at a predetermined location, said disturbance being effective to enable temperature sensing.

12. The waveguide of claim 10 wherein said solid cladding comprises at least two dissimilar cladding layers.

13. The ultrasonic waveguide of claim 10 wherein said cladding is of thermally sprayed stainless steel.

14. The waveguide of claim 10 wherein both said core and said cladding are respectively of a material having a melting point above 500° C.

15. The waveguide of claim 10 wherein said core and said cladding are respectively of a material such that the longitudinal and shear wave velocities of said core are higher than the respective velocities of said cladding.

16. The waveguide of claim 10 wherein said core has a non-circular cross-section.

* * * * *